United States Patent [19]

Kimura

[11] 3,813,610

[45] May 28, 1974

[54] PHASE-LOCKED LOOP IN WHICH FREQUENCY DIVIDER RATIOS ARE ALTERED TO OBTAIN RAPID LOCK-IN

[76] Inventor: Masahiro Kimura, 6-1-246, 2 chome, Wakamatsu-Cho, Funabashi, Japan

[22] Filed: Feb. 14, 1973

[21] Appl. No.: 332,339

[30] Foreign Application Priority Data

Mar. 8, 1972 Japan .............................. 47-023859

[52] U.S. Cl. .................................... 331/1 A, 331/25

[51] Int. Cl. .............................................. H03b 3/04

[58] Field of Search ......................... 331/1 A, 18, 25

[56] References Cited

UNITED STATES PATENTS 3,534,285 10/1970 Kobold et al. ..................... 331/18 X

*Primary Examiner*—Herman Karl Saalbach
*Assistant Examiner*—Siegfried H. Grimm
*Attorney, Agent, or Firm*—Ostrolenk, Faber, Gerb & Soffen

[57] ABSTRACT

A phase locked loop for maintaining a voltage controlled oscillator within the locked-in range by means of excess pulse detectors provided for both high or low frequency deviations which function to significantly alter the dividing ratios of the dividing circuits respectively coupled to the voltage controlled oscillator and the standard signal oscillator to effect a rapid return to the locked-in state.

10 Claims, 4 Drawing Figures

PHASE-LOCKED LOOP IN WHICH FREQUENCY DIVIDER RATIOS ARE ALTERED TO OBTAIN RAPID LOCK-IN

The present invention relates to phase locked loops and more particularly to a novel phase locked loop system in which the divider circuits employed therein are controlled by excess pulse detectors to significantly change the dividing ratios of one or the other of the dividing circuits to effect rapid return of the voltage controlled oscillator to the locked-in range.

BACKGROUND OF THE INVENTION

The present invention is directed to an improved technique for pulling a phase-locked loop system into the locked-state in cases where the system may go out of the locked-in state. The key feature of the phased-locked loop is the phase comparator which compares the phase difference of two input signals derived respectively from a standard signal oscillator and a voltage controlled oscillator each of whose outputs are passed through divider circuits. The phase comparator may, for example, employ a set-reset flip-flop which generates a square wave whose pulse width corresponds to the phase difference of the two inputs employed in the system. This type of output is called a pulse duration modulation (PDM) signal. The generated square wave developed by the phase comparator is filtered by a low pass filter which develops a d.c. voltage output linearly related to the pulse width of the PDM pulses. The d.c. output voltage of the phase comparator is fed back to the voltage controlled oscillator to control its output frequency.

Let it be assumed that the VCO is designed to oscillate at a higher frequency when a higher d.c. voltage level is applied thereto. Making reference to FIG. 1 of the application, if the output terminal $\overline{\text{PDM}}$ is employed as the input to the low pass filter 20, the loop will remain in the locked state as long as the output of VCO is within the lockedin range (i.e. the frequency range in which the loop can maintain the locked-in state without any external support). The reasons for this are as follows:

1. The $\overline{\text{PDM}}$ signal is lowered when the divided VCO output is applied to the phase comparator and raises when the divided standard signal is applied to the phase comparator.

2. When the divided VCO output occurs at a slightly faster rate (i.e. a higher frequency rate, but a rate which is still within the locked-in range), the $\overline{\text{PDM}}$ then also decreases at a faster rate. Therefore, a slightly narrower pulse is developed at the $\overline{\text{PDM}}$ output. The d.c. voltage from the low pass filter will go slightly lower, causing the VCO to oscillate at a slightly lower frequency thus maintaining the automatic control system in the locked-in state.

3. As long as the VCO frequency does not depart from the locked-in range, the phase comparator controls the VCO within the locked state as described hereinabove. The problem arises when the system goes to the unlocked state either accidentally or intentionally to an extent wherein it lies outside of the normal locked-in range. Thus, the system must be capable of recovering the locked-in state even in such instances.

The following techniques have been employed in the past:

1. Two types of error-indicating signals are taken from the system wherein one signal indicates a higher frequency deviation while the other signal indicates a lower frequency deviation. Both of these signals are then amplified and separately fed into the VCO to control the oscillation whereby the frequency output is made to be reverse that of the type of deviation detected causing the VCO to move to the correct frequency. It has been found however that this method is rather complicated and costly. Moreover, it should further be noted that the detected error signal is diminished when the VCO moves closer to the correct frequency so that the movement of the correct frequency toward the locked-in range becomes slower and slower and hence the recovery rate is totally dependent on the magnitude of the frequency deviation.

2. The second method utilizes a technique such that when the VCO frequency is high and the system goes out of the locked-in state, the input pulse to the phase comparator increases. This means that one or more excess pulses would arrive at the phase comparator between the interval of two standard frequency inputs. Thus, when the second pulse arrives before the corresponding opposite signal pulse, the input to the divider from the VCO is terminated by a gate and cannot be released until the occurrence of the opposite signal. This conventional technique has the following two major deficiencies:

Similar to the deficiency of the first conventional method referred to above, once the VCO frequency moves back toward the correct frequency, the waiting time becomes shorter and the frequency movement to the locked-in range thus becomes slower.

The second point is that the method requires a very stable d.c. voltage. If the $\overline{\text{PDM}}$ terminal is utilized as the output of the comparator, the system can stay in the locked-in state due to its self-recovering force within the locked-in range. However, when the frequency rate of the VCO deviates widely from the locked-in range, the programmable divider stops dividing until the opposite input arrives at the phase comparator. During that time, the $\overline{\text{PDM}}$ signal is kept high longer than before, because the programmable divider begins dividing after being released by the opposite signal. Thus, the next output from the programmable divider arrives at the comparator later than the case when the divider did not stop its dividing. In this case, the delay time is nearly equal to the waiting time. The later output makes for a wider $\overline{\text{PDM}}$ duty cycle. This exceeding width generates a higher d.c. voltage from the low pass filter. The voltage moves to the opposite direction compared with a locked-in state. Thus, if an operator desires to adjust this discrepancy he has to prepare one stable reference voltage higher than the low pass filter output and the active element of the VCO must be operated between the reference voltage and the d.c. output of the filter circuit.

BRIEF DESCRIPTION OF THE INVENTION

The present invention employs divider circuits whose dividing ratio may be adjusted in accordance with the operation of excess pulse-detecting circuits which, dependent upon the direction of frequency change, applies the signal to one or the other of the dividing circuits to rapidly and significantly change the dividing ratio of such dividing circuit by a significant amount whereby the adjusting "force" is very much emphasized as compared with conventional devices and the VCO is significantly altered in frequency to rapidly and effectively return to the locked-in state.

It is therefore one object of the present invention to provide a novel phase lock loop system in which the divider circuits employed to provide the frequency outputs of the standard and voltage controlled oscillators are adapted to have their dividing ratios rapidly change upon the occurrence of an excess pulse so as to abruptly and remarkably return the system to the locked-in range.

BRIEF DESCRIPTION OF THE FIGURES

The above as well as other objects of the present invention will become apparent when reading the accompanying description and drawings, in which.

DETAILED DESCRIPTION OF THE FIGURES

Figure 1:
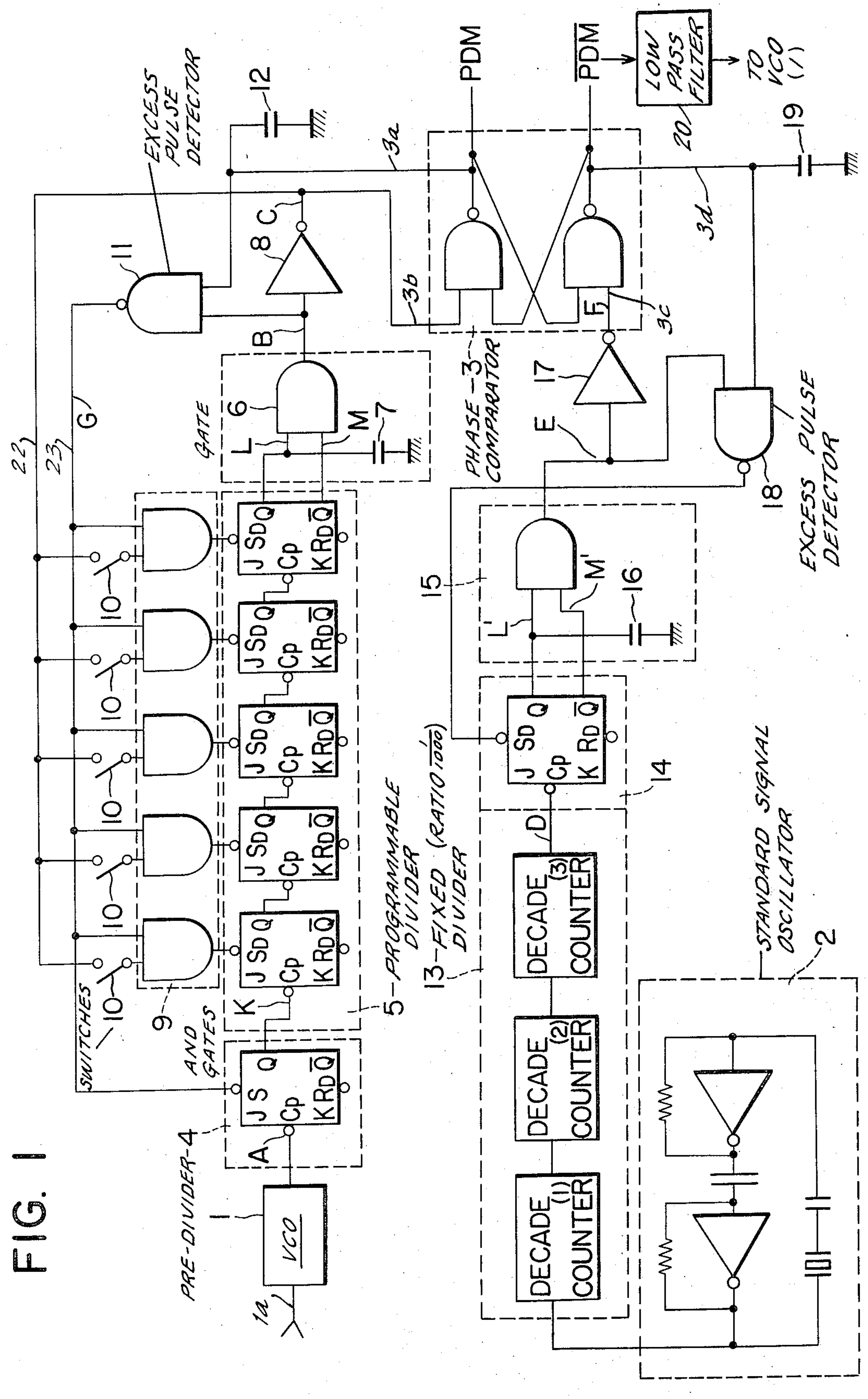
FIG. 1 is a block diagram of a phase locked loop system designed in accordance with the principles of the present invention.
Figure 2:
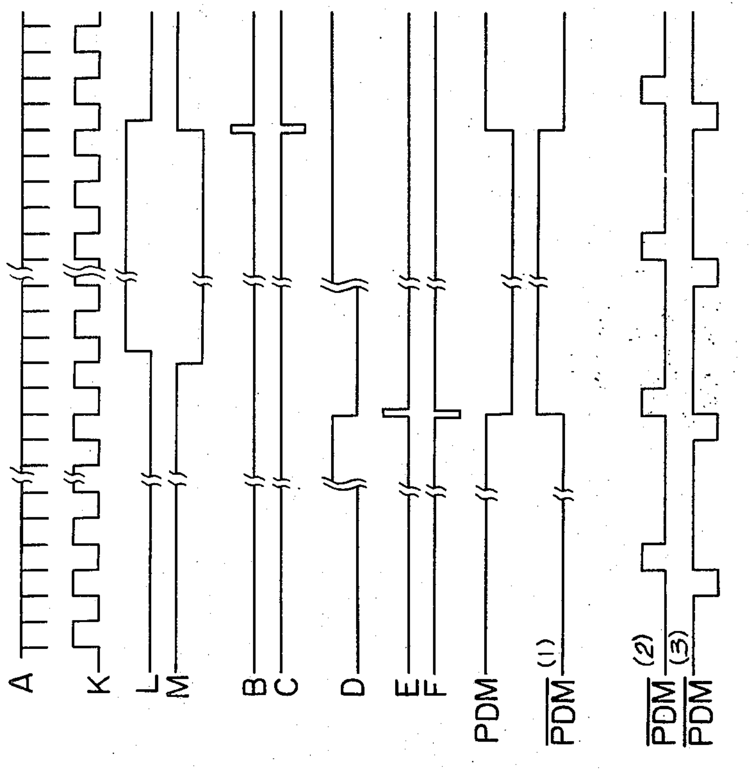
FIG. 2 shows a plurality of waveforms useful in describing the system of FIG. 1 when operating in the locked-in state.

FIG. 1 shows a phase-locked loop system designed in accordance with the principles of the present invention, which system is comprised of a voltage controlled oscillator "VCO" 1 which operates under control of a d.c. voltage applied to its input 1a to develop an output signal whose negative pulses appearing at terminal A occur at a frequency rate determined by the level of the d.c. voltage coupled to its input. Waveform A of FIG. 2 shows the typical output of the VCO 1. The output of VCO 1 is coupled to the input of a J-K flip-flop 4, input terminal A being the trigger input such that the outputs Q and $\overline{Q}$ of flip-flop 4 change state each time a negative going pulse (see waveform A, FIG. 2) is applied to input A. Flip-flop 4 is further provided with a set input S which causes the output at Q to change upon the occurrence of each negative going pulse from VCO 1. Thus, J-K flip-flop 4 can be altered to operate as a dividing circuit whose dividing ratio is 1:2 with no set input pulse and whose ratio changes to 1:1 when a pulse is applied to the set input terminal S.

The Q output of J-K flip-flop 4 is coupled to the trigger input of the first stage of a programmable divider 5 which is comprised of five J-K flip-flops connected in cascade fashion as shown. The output of each J-K flip-flop is coupled to the trigger input of the next adjacent J-K flip-flop. Each of these flip-flops are further provided with a set input terminal $S_n$ such that the flip-flop receiving a pulse at its set input terminal is caused to change its dividing ratio from 1:2 (when no signal is applied to its set terminal) to 1:1 when a signal is applied to its set input terminal. The programmable divider is thus capable of changing its overall dividing ratio over the range from 1:32 to 1:1, depending upon the set input terminals which may selectively receive a signal.

The Q and $\overline{Q}$ outputs of the last J-K flip-flop stage of programmable divider 5 are coupled to corresponding inputs of AND gate 6 which functions to develop an output at B when the signals at both of its input terminals L and M are simultaneously high. A time delay capacitor 7 is coupled between input terminal L and ground to serve as a delay means for delaying the rate at which the signal applied to input terminal L goes low. For example, the Q and $\overline{Q}$ outputs of the J-K flip-flop are always in the opposite state so that when the Q output is high, the $\overline{Q}$ output is low, and vice versa. Let it be assumed that the Q output is high and the next pulse applied to the trigger input $C_P$ causes the state of the J-K flip-flop to change. At this time, output Q will want to go low, but will be delayed due to the presence of time delay capacitor 7. As soon as the trigger input pulse is applied, the $\overline{Q}$ output will abruptly go high causing the Q and $\overline{Q}$ outputs to both be high for a brief interval. This causes AND gate 6 to develop a positive going pulse (see waveform B, FIG. 2) whose time duration is substantially equal to the time delay imposed by capacitor 7.

The output of AND gate is coupled simultaneously to one input of an excess pulse detector gate 11 and one input of an inverter 8. Inverter 8 functions to invert the level of the signal applied to its input. Hence, when a positive going pulse (waveform B, FIG. 2) is applied to its input inverter 8 converts this to a negative going pulse (see waveform C, FIG. 2) which pulse is simultaneously applied to one input 3b of a set-reset flip-flop 3 and to a common conductor 22 coupled in common to the stationary contacts of a plurality of switches 10. Switches 10 are selectively positionable to couple the output of inverter 8 to respective inputs of AND gates 9 whose remaining inputs are coupled in common to a conductor 23 coupled to the output of excessive pulse detector gate 11. Line 23 is also further connected to the set input terminal of the predivider (i.e. J-K flip-flop) 4. The outputs of AND gates 9 are coupled to respective set input terminals of the J-K flip-flop stages making up the programmable divider 5. By selective closure of switches 10, the AND gates 9 function to apply a signal to the set terminals of those J-K flip-flops whose switches 10 are closed and which gates simultaneously receive pulses from the output of excess pulse detector gate 11 and inverter 8. By selective closure of switches 10 the dividing ratio of the programmable divider 5 can be altered from a dividing ratio of 1:32 up to a dividing ratio of 1:1.

FIG. 1 is further comprised of a standard signal oscillator 2 whose output is coupled to a fixed divider 13 comprised of three decade counter stages forming a divider whose dividing ratio is fixed (i.e. not variable). For example, in one embodiment, the dividing ratio is chosen to be 1:1000. The output D of the last decade counter stage is coupled to the trigger input of a J-K flip-flop stage 14 which funtions in the same manner as the decade flip-flops described hereinabove and which has its Q and $\overline{Q}$ outputs coupled to respective inputs L′ and M′ of AND gate 15. The L′ input is coupled through a time delay capacitor 16 to ground potential and functions to develop a narrow positive going pulse at its output E in the same manner as gate 6 described hereinabove wherein the time delay imposed upon the high level output signal at Q of J-K flip-flop 14 as it attempts to go low is substantially equal to the width of the positive going output pulse (waveform E, FIG. 2) developed at the output E of gate 15. Output E is simultaneously coupled to the input of inverter 17 and one input of excess pulse detecting gate 18. Inverter 17 functions to invert the signal applied to its input (waveform E, FIG. 2) so as to develop the opposite level at its output (see waveform F, FIG. 2). The output F is coupled to input 3c of phase comparator 3. The set-reset flip-flop (i.e. phase comparator 3) is comprised of a pair of two input NAND gates cross-coupled in the manner shown to form a flip-flop. Phase comparator 3 is provided with two inputs 3b and 3c and two outputs 3a and 3d, respectively coupled to associated inputs of excess pulse detectors 11 and 18 as shown. Outputs 3a and 3d are further respectively coupled through time delay capacitors 12 and 19 to ground potential and serve to delay the rate of change of the signal level for a purpose to be more fully described. The set-reset flip-flop (i.e. phase comparator 3) functions to generate a square wave whose width corresponds to the phase difference of the signals applied to its inputs *3b* and *3c*. This type of output is typically referred to as a pulse duration modulation (PDM) signal and hence the outputs *3a* and *3d* of phase comparator 3 will hereinafter be referred to as the PDM and the $\overline{\text{PDM}}$ signals.

The $\overline{\text{PDM}}$ output thus generates a positive-going square pulse signal whose time duration is a function of the phase relationship between the input signals applied at *3b* and *3c*. The $\overline{\text{PDM}}$ output is applied to a low pass filter 20 which functions to smooth the square pulse output to develop a d.c. signal which is applied to the input of the voltage controlled oscillator 1 wherein the level of the d.c. signal developed by the low pass filter 20 determines the frequency rate of VCO1.

The operation of the system of FIG. 1 is as follows:

The VCO signal (waveform A, FIG. 2) is applied to the programmable divider whose dividing ratio is variable and the divider output goes to one input of phase comparator 3. In the arrangement of FIG. 1, the output of programmable divider 5 is connected to the set terminal of the set-reset flip-flop (i.e. phase comparator) 3 through gate 6 and inverter 8. The remaining or reset input 3c receives, through gate 15 and inverter 17, the output of a fixed divider (i.e. whose dividing ratio is fixed) and whose input is taken from the standard signal oscillator 2. The PDM output of phase comparator 3 goes high when the output of programmable divider 5 goes low (see waveform C and waveform PDM of FIG. 2). At this time the $\overline{\text{PDM}}$ output is low (see waveform $\overline{\text{PDM}}$(1), FIG. 2). Conversely, the $\overline{\text{PDM}}$ output of comparator 3 goes high upon the occurrence of an output pulse from inverter 17 (see waveforms F and $\overline{\text{PDM}}$(1), FIG. 2). It can clearly be seen from waveforms PDM and $\overline{\text{PDM}}$(1) shown in FIG. 2 that these outputs are always in the opposite states. The phase comparator thus generates a square wave, the duty cycle of which is equal to the phase difference of the signals appearing at its two input terminals *3b* and *3c*. The input of low-pass filter 20 is coupled to the $\overline{\text{PDM}}$ output and generates a d.c. output, the voltage level of which corresponds linearly to the input pulse width. This d.c. voltage level controls the VCO frequency. It is necessary to provide a signal which indicates when the phase-locked loop goes out of the locked-in state and it is further necessary that this signal provides information as to which direction the frequency of the VCO has moved, i.e. either higher or lower than the frequency of the locked-in state.

If the system is in the unlocked state then both input terminals of the phase comparator 3 cannot accept equal frequency signals, but one of them must be high (or low) and two signal pulses at one input can be seen between two signal pulses of the other input when neither of the inputs occur in an alternating fashion. For example, if two pulses are derived from the programmable divider 5 before a pulse is developed from the fixed divider 13, PDM would still be high. Thus, if the PDM signal and the pulse from the programmable divider constitute the inputs to the excess pulse detector 11 which may be either an AND or an NAND gate, the gate output is thus the excess pulse compared with the other input. Prior art systems employ this pulse for generating a certain indicating current or for stopping the input pulse of the divider.

The system of the present invention employs the excess pulse to alter the dividing ratio of the programmable divider, or the fixed divider, as the case may be.

Utilizing this arrangement, if VCO-1 oscillates at a frequency which is higher than the frequency of the locked-in range and if the excess pulse is detected to thereby lower the dividing ratio (for example, to 1:1) the output of the divider is increased significantly. Only one excess pulse is enough to change the dividing ratio. For example, let it be assumed that the dividing ratio is 1:10, then the excess pulse detection will change its ratio to 1:1. Hence the pulses will occur at the programmable divider at a frequency rate which is the same as the frequency rate of VCO1 which means that the pulses appearing at the output of programmable divider 5 now occur at ten times their normal frequency rate, i.e. the frequency rate at which no excess pulse is generated. Thus, a slight deviation is emphasized tenfold due to the detected excess pulse. When excess pulses occur at a much more frequent rate, output $\overline{\text{PDM}}$ is maintained at a low level until the phase difference between the input pulses applied at *3b* and *3c* is reduced, i.e. until the loop recovers or returns to the locked-in state. As long as the $\overline{\text{PDM}}$ output is kept low, VCO1 is controlled to oscillate at a lower frequency.

This method pulls the system into the locked-in state very rapidly and very effectively, requiring as little as only a single detected excess pulse and hence the recovery rate of the system is not weakened as is the case with prior art structures which significantly reduce the recovery rate as the locked-in frequency range is approached causing return to the locked-in state to be a very slow process.

Returning to a consideration of the waveform shown in FIG. 2, when the phase-locked loop is in the locked state, VCO1 accepts the controlling d.c. voltage from low pass filter 20. During the locked-in state no excess pulses are developed at the outputs of either of the excess pulse detectors 11 and 18. As shown in FIG. 2, the VCO output (waveforms A) toggles J-K flip-flop 4 to develop the square wave output K. Depending upon the particular dividing ratio of programmable divider 5, the Q output of the last J-K flip-flop stage will ultimately go high and thereafter ultimately go low, as shown by waveform L of FIG. 2. When the Q output of this flip-flop stage goes low, its $\overline{Q}$ output abruptly goes high. Time delay capacitor 7, however, delays the rate at which the Q output goes low and hence Q and $\overline{Q}$ outputs will both be high for a brief interval causing gate 6 to develop a positive going output pulse (waveform B) whose time duration is substantially equal to the time interval at which Q and $\overline{Q}$ outputs are high (see waveforms L and M). Inverter 8 inverts this pulse, as shown by waveform C. The output pulse from inverter 9 causes outputs PDM and $\overline{PDM}$ to go high and low, respectively.

Standard signal oscillator 2 applies its output to fixed divider 13 whose final stage will go high and remain high for a predetermined time interval and will go low as shown by waveform D. D is applied to the toggle input of J-K flip-flop 14 which functions in the same manner as the J-K flip-flops of predivider 4 and programmable divider 5 to develop the Q and $\overline{Q}$ outputs. Gate 15 develops the positive going pulse E in the same manner as was described for gate 6 and this pulse is inverted by inverter 17 to develop a negative going pulse (see waveforms E and F). The F signal causes $\overline{PDM}$ to go high and PDM to go low, thus when the pulses C and F appear in alternating fashion, output $\overline{PDM}$ goes alternately high and low, as shown by waveform $\overline{PDM}$ (1).

Figure 3:
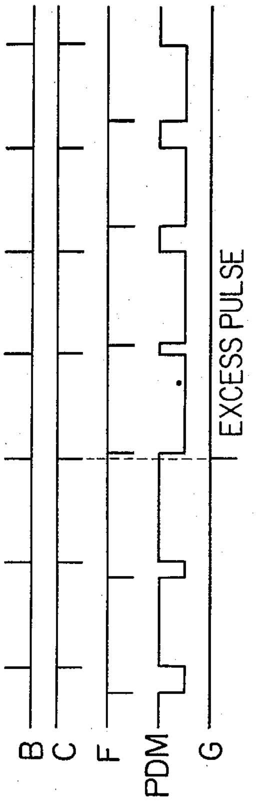
FIG. 3 shows a plurality of waveforms useful in describing the manner in which excess pulses are detected when the system of FIG. 1 is in the unlocked state.
Figure 4:
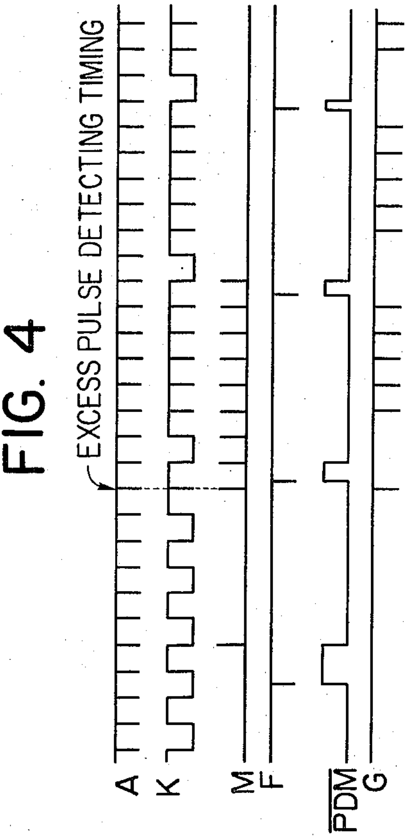
FIG. 4 shows a plurality of waveforms showing the system timing of FIG. 1 when operating in the unlocked state.

The last two waveforms $\overline{PDM}$ (2) and $\overline{PDM}$ (3) indicate that the duty cycle of the positive going pulses of the $\overline{PDM}$ output will change from a narrow pulse width $\overline{PDM}$ (2) to a wide pulse width $\overline{PDM}$ (3) based upon the phase difference of the signals C and F. When VCO oscillates at too high a rate and goes to the unlocked state, the excess pulse is detected at gate 11 of FIG. 1 as shown by waveform G of FIG. 3. At that time the negative going signal is simultaneously applied to all of the AND gates 9 (whose switches 10 are closed) and to the terminals of predivider 4 and the J-K flip-flop stages of programmable divider 5. At this time, all of the flip-flops in stages 4 and 5 are set causing the divider 5 to operate at the dividing ratio of 1:1. This causes the output at C to be developed at a frequency rate which is the same as the frequency rate of the output at A. $\overline{PDM}$ is maintained at a low level by the C pulses due to the rapid rate at which the C pulses are applied to phase comparator 3. Thus, the d.c. voltage developed by low pass filter 20 goes quite low, causing VCO to generate a significantly lower frequency output signal. Once VCO moves back into the locked-in state, signals G are no longer present. The system thus returns to the locked-in state and will operate in accordance with the timing relationships shown in FIG. 2.

Assuming that the VCO1 frequency goes too low, the standard signal developed at the output of fixed divider 13 will be applied to phase comparator 3 at an excessive rate causing an excess pulse to be developed by gate 18, whereby flip-flop 14 will receive the output signal from gate 18 to alter the dividing ratio of stage 14 from 1:2 to 1:1, thus the $\overline{PDM}$ output will be maintained high since the rate of application of pulses to input *3c* will far exceed the rate of application of pulses to input *3b*. This will cause low-pass filter 20 to very significantly increase the d.c. signal applied to VCO1 so as to rapidly return the system to the locked-in state.

The time delay capacitors 12 and 19 protect the excess pulse detectors 11 and 18 from detecting the first pulse as an excess pulse if the propagation delay of the phase comparator is very short and if the output (for example, the PDM output) is raised to a high level before the pulse from inverter 8 has terminated.

It can be seen from the foregoing description that the present invention provides an improved phase locked loop in which any frequency change of the voltage controlled oscillator outside of the normal corrective range is very rapidly and very effectively brought back to the locked-in range through a technique in which the occurrence of a single excess pulse by either a fixed or programmable divider causes one of these dividers to change its dividing ratio by a significant amount to effect the rapid return to the locked in range.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

What is claimed is:

1. A phase locked loop system for maintaining a predetermined frequency output comprising:

first voltage controlled oscillator means for generating an output signal whose frequency is dependent upon the level of a d.c. voltage applied to its input;

second oscillator means for generating an output signal of a fixed frequency;

first and second frequency divider means each respectively coupled to the outputs of said first and second oscillator means;

phase comparator means having first and second inputs and first and second outputs;

said first and second inputs being respectively coupled to the outputs of said first and second divider means;

said phase comparator means being adapted to generate a square pulse signal at said first output wherein the pulse width of said square pulses is a function of the phase relationship between the signals applied to said first and second inputs;

filter means coupled to said first output for converting said square pulses into a d.c. signal the level of which is a function of the pulse width of said square pulses, said d.c. signal being coupled to the input of said first oscillator means for controlling the frequency of said first oscillator means;

first excess pulse detector means having inputs coupled to one output of said phase comparator means and the output of one of said divider means for generating a first output signal when the output frequency of said first oscillator means deviates in one direction from the desired predetermined frequency;

said one of said divider means having at least one set input for altering the dividing ratio of said divider means upon the detection of an excess pulse;

means coupled between said excess pulse detector means and the set input terminal of said one of said divider means for altering said dividing ratio;

said one divider means being adapted to apply its output to said phase comparator means for alterning the d.c. level signal applied to said first oscillator means.

2. The system of claim 1 further comprising second excess pulse detector means having inputs coupled to the output of the remaining one of said divider means and the second output of said phase comparator means for generating a second output signal when the output frequency of said first oscillator means deviates in a second direction from the desired predetermined frequency;

the remaining one of said divider means having a set input terminal coupled to the output of said second excess pulse detector means for altering its dividing ratio upon receipt of said second output signal.

3. The system of claim 2 wherein said first divider means is a programmable divider having a plurality of flip-flop stages each stage having a trigger input, set input and output terminals, the trigger input terminals of each stage being coupled to an output terminal of the preceeding stage; the trigger input of the first stage being coupled to the output of said first oscillator means, and means coupling the output of the last stage to one input of said phase comparator means.

4. The system of claim 2 wherein said second divider means comprises a plurality of fixed divider stages and a variable divider stage; said variable divider stage comprising a flip-flop having a trigger input, a set input and an output; said trigger input being coupled to the output of at least one of said fixed divider stages and said set input terminal being coupled to the output of said second excess pulse detector means.

5. The system of claim 3 further comprising gate means coupled between said first divider means and said phase comparator means for generating a narrow pulse applied to said first excess pulse detector means and said phase comparator means upon termination of the output signal developed by said first divider means.

6. The system of claim 4 further comprising gate means coupled between said second divider means and said phase comparator means for generating a narrow pulse applied to said second excess pulse detector means and said phase comparator means upon termination of the output signal developed by said first divider means.

7. The system of claim 3 wherein said means coupled between said first excess pulse detector means and said first divider means comprises a plurality of two input gates a first input of each of said gates being coupled in common to the output of said first excess pulse detector means;

a plurality of switch means each operable between an open and a closed position for selectively coupling each of the remaining inputs of said gates to one output of said phase comparator means;

the outputs of said gates being coupled to the set input terminals of selected ones of said flip-flop stages for altering the dividing ratio of those flip-flop stages whose associated switch means are in the closed position.

8. The system of claim 7 wherein the set input terminal of at least one of said flip-flop stages of said first divider means is directly coupled to the output of said first excess pulse detector means.

9. The system of claim 5 further comprising inverter means coupled between the output of said gate means and said phase comparator means.

10. The system of claim 6 further comprising inverter means coupled between the output of said gate means and said phase comparator means.

* * * * *